United States Patent

Ho et al.

[11] Patent Number: 6,022,800
[45] Date of Patent: Feb. 8, 2000

[54] METHOD OF FORMING BARRIER LAYER FOR TUNGSTEN PLUGS IN INTERLAYER DIELECTRICS

[75] Inventors: Wen-Yu Ho; Sen-Nan Lee, both of Hsinchu; Sung Chun Hsieh, Taipei; Hui-Lun Chen, I-Lan, all of Taiwan

[73] Assignee: Worldwide Semiconductor Manufacturing Corporation, Hsinchu, Taiwan

[21] Appl. No.: 09/069,711

[22] Filed: Apr. 29, 1998

[51] Int. Cl.[7] .................................................. H01L 21/4763
[52] U.S. Cl. ....................... 438/643; 438/637; 438/648; 438/653; 438/656; 438/666; 438/668; 438/672; 438/680; 438/685
[58] Field of Search ..................................... 438/637, 648, 438/643, 653, 656, 666, 668, 672, 680, 685

[56] References Cited

U.S. PATENT DOCUMENTS

| | | | |
|---|---|---|---|
| 5,049,975 | 9/1991 | Ajika et al. | 438/643 |
| 5,162,262 | 11/1992 | Ajika et al. | 438/643 |
| 5,342,652 | 8/1994 | Foster et al. | |
| 5,403,779 | 4/1995 | Joshi et al. | 438/634 |
| 5,418,180 | 5/1995 | Brown . | |
| 5,472,912 | 12/1995 | Miller | 438/643 |
| 5,565,708 | 10/1996 | Ohsaki et al. | 257/764 |
| 5,567,483 | 10/1996 | Foster et al. | 427/535 |
| 5,585,673 | 12/1996 | Joshi et al. | 257/751 |
| 5,593,511 | 1/1997 | Foster et al. | 148/238 |
| 5,608,247 | 3/1997 | Brown . | |
| 5,610,106 | 3/1997 | Foster et al. . | |
| 5,614,756 | 3/1997 | Forouhi et al. . | |
| 5,654,233 | 8/1997 | Yu | 438/643 |
| 5,688,382 | 11/1997 | Besen et al. | 204/192.12 |
| 5,688,718 | 11/1997 | Shue . | |
| 5,723,362 | 3/1998 | Inoue et al. | 438/643 |
| 5,780,356 | 7/1998 | Kim | 438/627 |
| 5,789,321 | 8/1998 | Ohshita | 438/680 |
| 5,833,817 | 11/1998 | Tsai et al. | 438/648 |
| 5,851,917 | 12/1998 | Lee | 438/627 |
| 5,912,508 | 6/1999 | Iacoponi | 257/770 |

OTHER PUBLICATIONS

Danek et al., "Resistivity reduction and chemical stabilization of organometallic chemical vapor deposited titanium nitride rf plasma"; Appl. Phys. Lett. 68(7), Feb. 12, 1996 pp. 1015–1016.

*Primary Examiner*—John F. Niebling
*Assistant Examiner*—Lynne A. Gurley
*Attorney, Agent, or Firm*—Blakely Sokoloff Taylor & Zafman

[57] ABSTRACT

A method of reducing tungsten plug loss in processes for fabrication for silicon-based semiconductor devices that include a tungsten plug in a high aspect ratio contact hole. The invention provides a barrier layer prepared by first forming a conformal layer of titanium nitride by chemical vapor deposition. Afterward, another film of titanium nitride is supplied by plasma vapor deposition. The barrier layer comprises at least these two films, and tungsten is then deposited to at least fill the high aspect ratio film-coated contact hole. Upon removal of excess tungsten as by wet etch back, the tungsten plug remains essentially intact, and any plug loss is insignificant in comparison with the prior art.

10 Claims, 2 Drawing Sheets

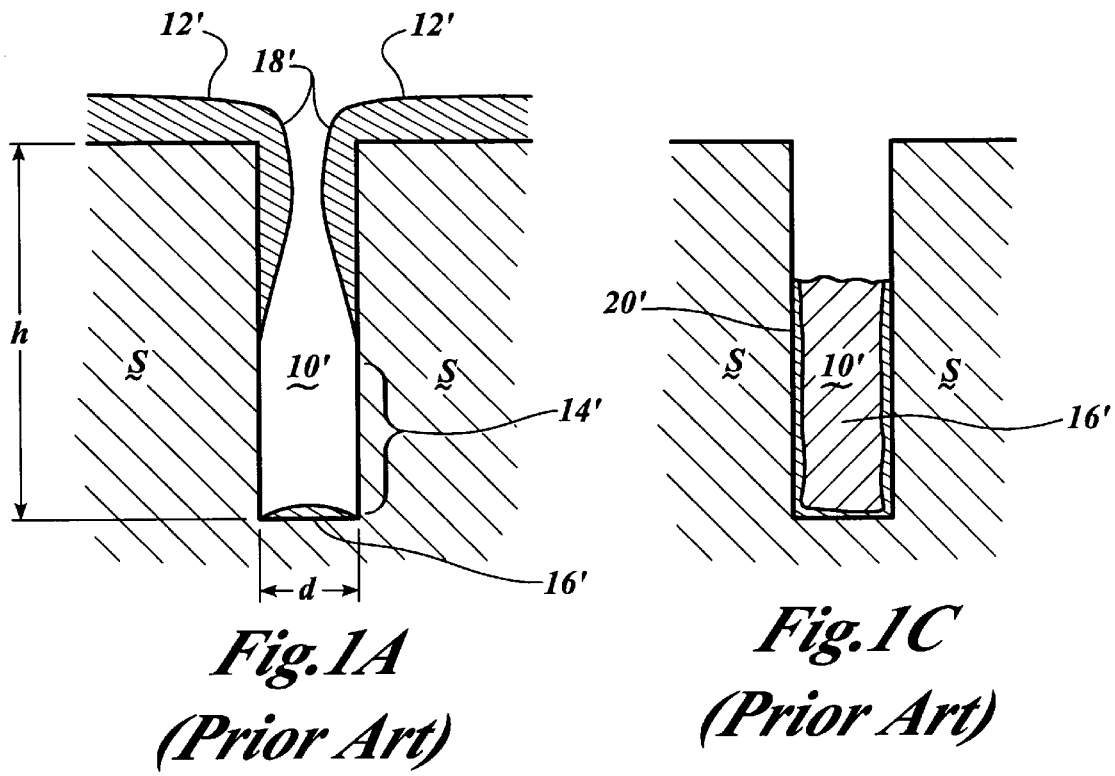
Fig. 1A (Prior Art)
Fig. 1C (Prior Art)
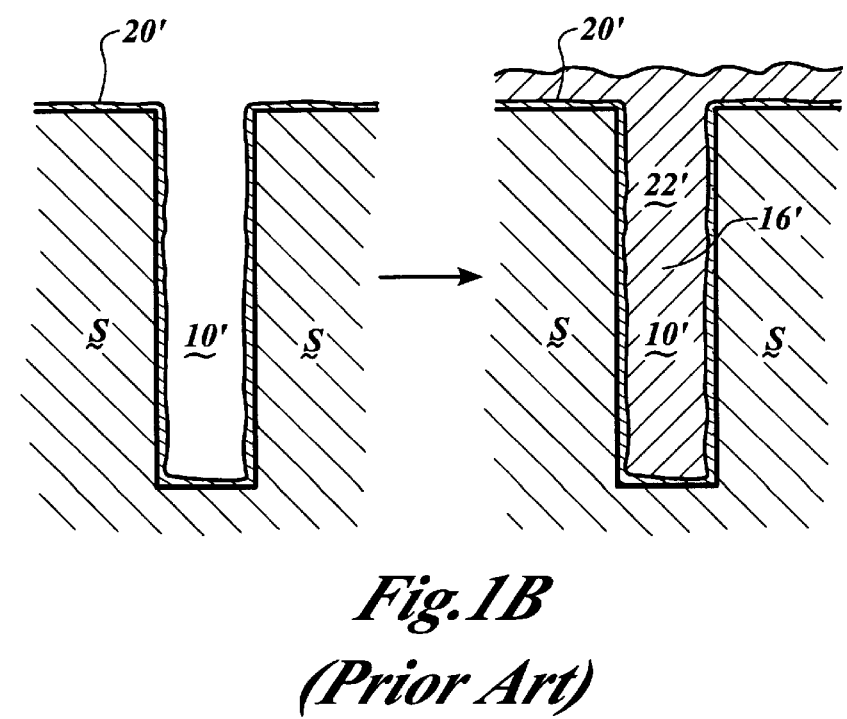
Fig. 1B (Prior Art)

METHOD OF FORMING BARRIER LAYER FOR TUNGSTEN PLUGS IN INTERLAYER DIELECTRICS

FIELD OF THE INVENTION

The invention relates to the formation of tungsten plugs in the fabrication of semiconductor devices, and in particular to the formation of titanium nitride barrier layers separating the tungsten plugs from the silicon substrate.

BACKGROUND OF THE INVENTION

Semiconductor devices have become widespread in use in modern society, and indeed, have become indispensable in a variety of devices and services. Nevertheless, these devices are still prepared from a basic silicon wafer substrate that is treated by a variety of processes that selectively etch, and deposit films to produce microscopic structures in the wafer to allow it to perform its desired functions in electronic applications.

In the manufacture of semiconductor devices from silicon wafers, it is sometimes desirable to create a high aspect ratio contact hole in interlayer dielectrics which is filled with tungsten. However, it is for many reasons considered undesirable to permit direct contact between the tungsten plug and the dielectric layer. As a result, a "barrier layer" or "barrier film" is usually employed to separate the tungsten plug from the dielectric layer. However, present methods for forming such a barrier layer are inadequate, and lead to "plug loss" and a defective device. As shown in FIG. 1A, depicting the prior art, when a high aspect ratio hole 10' in a dielectric layer is coated with titanium nitride (TiN) film 12' using physical vapor deposition (PVD) as is conventional, the PVD TiN coating does not conform to the hole, i.e. it does not cover the entire surface of the high aspect ratio hole. Rather, the lower extremities 14' of the hole are not covered, while the base 16' and upper extremities 18' are covered. If this hole were filled with tungsten, there would be direct contact with the dielectric layer S As a result, conventional techniques for forming a barrier layer instead rely on using the chemical vapor deposition (CVD) process. As shown in FIG. 1B, the CVD process forms a conformal layer 20' in the high aspect hole 10'. The hole can then be filled with tungsten (W) to form plug 22', for example by chemical vapor deposition or another technique. Thereafter, however, dry etching of the tungsten layer inevitably results in "plug loss"the upper portion of the plug is removed during the etching process, as shown in FIG. 1C, resulting in a defective device.

There yet exists a need for a method of forming a tungsten plug during semiconductor device fabrication, that maintains substantially the entire plug and reduces plug loss to insignificance. Preferably, the method should be relatively inexpensive and simple to integrate into standard semiconductor fabrication techniques.

SUMMARY OF THE INVENTION

The invention provides a method of reducing tungsten plug loss in processes for fabrication of semiconductor devices. In the method of the invention, a dielectric layer having a high aspect ratio surface feature, such as a hole, is provided with a barrier layer that includes at least two films. In the first step of the method, a conformal film of titanium nitride (TiN) is deposited by chemical vapor deposition (CVD). In another step, a film of TiN is applied by plasma vapor deposition (PVD). Thereafter, the tungsten (W) may be deposited by conventional processes, such as chemical vapor deposition, to fill the high aspect ratio surface feature.

Upon removal of excess tungsten, such as by the dry etch back process, the tungsten plug remains essentially intact, and any plug loss is insignificant in comparison with the prior art. Accordingly, the invention, by providing the additional step of plasma vapor deposition of a TiN film, after the CVD TiN film, substantially reduces tungsten plug loss and the risk of losses due to defective semiconductor devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A is a schematic representation of a prior art PVD TiN film applied to a high aspect ratio surface feature, such as a contact hole;

FIG. 1B is a depiction of the high aspect ratio surface feature after the prior art process of chemical vapor deposition of conformal TiN films and filling with tungsten; and FIG. 1C is a depiction of the removal of the upper portion of the plug in the prior art process showing a resulting defective device.

DETAILED DESCRIPTION OF THE PREFERRED EMBODIMENT

The invention relates to a method for reducing tungsten plug loss in the fabrication of silicon-based semiconductor devices. As explained above, conventionally a barrier layer is provided to separate the silicon substrate from tungsten in high aspect ratio contact holes. The reasons for such a barrier layer are not particularly germane to the invention, other than to note that such a layer is believed necessary for good operation of the device.

In accordance with the invention, a superior barrier layer that reduces tungsten plug loss includes at least two films that are produced by: a first step of depositing a conformal film of TiN by chemical vapor deposition in the high aspect ratio surface feature, of the dielectric layer; followed by another step of forming a film of TiN by plasma vapor deposition. The latter PVD TiN film may not be entirely conformal, and indeed, may not cover the lower extremities of the surface feature. The tungsten plug is then formed, by depositing tungsten in sufficient quantity to at least fill the high aspect ratio surface feature. Any excess tungsten may be removed by methods known in the art, such as the wet etch back process.

Figure 2A:
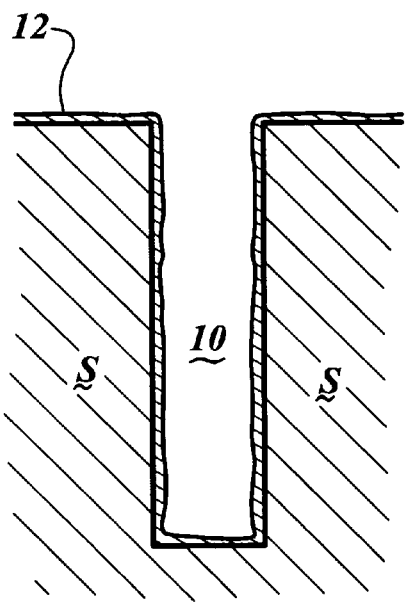
FIG. 2 is a series of illustrative, not-to-scale diagrams depicting an embodiment of the invention, after the steps of forming a conformal film of TiN with chemical vapor deposition; forming a film of TiN with plasma vapor deposition; depositing a tungsten plug; and after a wet etch back to remove excess tungsten.
Figure 2B:
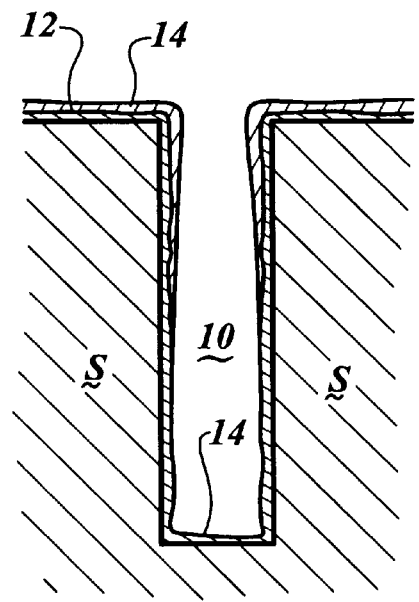
Figure 2C:
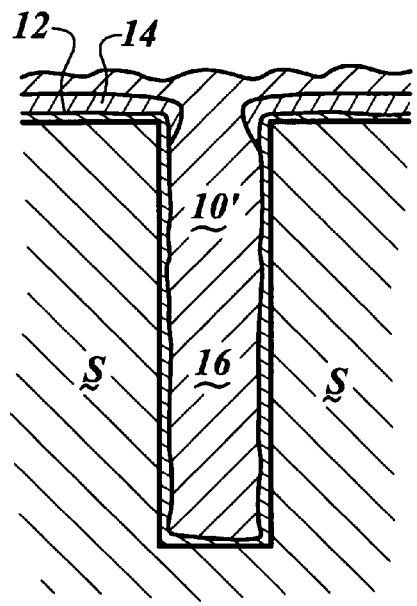
Figure 2D:
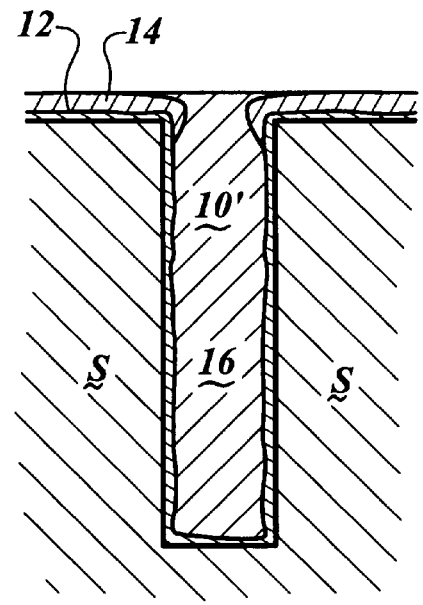

The invention may be better understood with reference to the attached FIG. 2, which is non-limiting, but which serves to illustrate the principles of the invention.

FIG. 2 illustrates a high aspect ratio surface feature 10 in a silicon substrate S. Typically, a high aspect surface feature has a h/d ratio in the range from about 2 to about 15, more especially about 5 to about 15.

As illustrated, in accordance with the invention, a TiN chemical vapor deposited conformal film 12, preferably of thickness in the range about 50 to about 200° A, is formed on the high aspect ratio surface feature 10, and on surrounding surfaces of the interlayer dielectric S, to the extent required. Thereafter, another TiN film 14, preferably of thickness about 100 to about 1,000° A, is formed by the PVD process by conventional means. This film 14 usually exhibits poor "step coverage", in that it usually does not provide conformal coverage of the high aspect surface feature, as shown. Thus, it may be expected that certain sections of the internal surface area of the hole or trench would not be covered by this film.

Upon application of at least the above films, a "barrier layer" has been formed. At this point, tungsten may be deposited to form a plug 16 in the hole, as illustrated. The tungsten plug 16, often deposited by chemical vapor deposition, fills the high aspect ratio feature and excess tungsten usually also extends across the surrounding surface of the dielectric layer S, as a result of the deposition process.

In order to make a useful device, it is usually necessary to remove the excess tungsten, and to retain only the tungsten plug 16 in the high aspect ratio feature. Thus, excess tungsten may be removed by the conventional wet etch back process. When wet etch back is employed, excess tungsten is removed, and the tungsten plug in the high aspect ratio feature is essentially unchanged, i.e., plug loss, if any, is insignificant as compared to the prior art and the device is not electronically defective by reason of any plug loss. As a result of practicing the method of the invention, tungsten plug loss has been essentially eliminated and a significant shortcoming in the prior art has been overcome.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of reducing tungsten plug loss in a process for fabrication of semiconductor devices, the method comprising:
   (a) selecting a device having dielectric layers and comprising at least one high aspect ratio contact hole;
   (b) depositing a conformal film of TiN by chemical vapor deposition;
   (c) forming a TiN film by plasma vapor deposition after the chemical vapor deposition; and
   (d) depositing sufficient tungsten by chemical vapor deposition to at least fill the high aspect ratio film-coated contact hole.

2. The method of claim 1, wherein the depositing of step (b) produces a conformed TiN film of thickness in the range from about 50 to about 200 Å.

3. The method of claim 1, wherein the forming of step (c) produces a TiN film of thickness in the range from about 100 to about 1,000 Å.

4. The method of claim 1, wherein the high aspect ratio of the contact hole is in the range from about 5 to about 15.

5. A method of reducing tungsten plug loss in a process for fabrication of silicon-based semiconductor devices, the method comprising:
   (a) selecting a device having dielectric layers and comprising at least one high aspect ratio contact hole;
   (b) depositing a conformal film of TiN by chemical vapor deposition;
   (c) forming a film of TiN by plasma vapor deposition after the chemical vapor deposition;
   (d) depositing sufficient tungsten to at least fill the high aspect ratio film-coated contact hole; and
   (e) removing excess tungsten while maintaining the contact hole substantially filled with tungsten.

6. The method of claim 5, wherein the depositing of step (b) produces a TiN coating of thickness in the range from about 50 to about 200 Å.

7. The method of claim 5, wherein the forming of step (c) produces a TiN film of thickness in the range from about 100 to about 1,000 Å.

8. The method of claim 5, wherein the high aspect ratio of the contact hole is in the range from about 5 to about 15 for the hole.

9. A method of reducing tungsten plug loss in a process for fabrication of semiconductor devices, the method comprising:
   (a) selecting a device having a dielectric layers and comprising at least one high aspect ratio hole;
   (b) depositing a conformal film of TiN having a thickness in the range from about 50 to about 200 Å, by chemical vapor deposition;
   (c) forming a TiN film having a thickness in the range about 100 to about 1,000 Å by plasma vapor deposition after the depositing of the conformed layer by chemical vapor deposition; and
   (d) depositing at least sufficient tungsten to fill the high aspect ratio film-coated contact hole.

10. The method of claim 9, further comprising removing any excess tungsten from dielectric surfaces surrounding the high aspect ratio surface feature while maintaining said surface feature substantially filled with tungsten.

* * * * *